United States Patent [19]

Aichelmann, Jr. et al.

[11] Patent Number: 4,458,349

[45] Date of Patent: Jul. 3, 1984

[54] METHOD FOR STORING DATA WORDS IN FAULT TOLERANT MEMORY TO RECOVER UNCORRECTABLE ERRORS

[75] Inventors: Frederick J. Aichelmann, Jr., Hopewell Junction; Lawrence K. Lange, Wappingers Falls, both of N.Y.

[73] Assignee: International Business Machines Corporation, Armonk, N.Y.

[21] Appl. No.: 388,830

[22] Filed: Jun. 16, 1982

[51] Int. Cl.³ .............................................. G06F 11/10
[52] U.S. Cl. .......................................... 371/13; 371/38
[58] Field of Search ..................................... 371/13, 38

[56] References Cited

U.S. PATENT DOCUMENTS 4,037,091 7/1977 Beuscher ............................. 371/13
4,175,692 11/1979 Watanabe ......................... 371/13 X
4,394,763 7/1983 Nagano et al. ....................... 371/38

OTHER PUBLICATIONS

Bachman et al., Multiple Error Correction, IBM Technical Disclosure Bulletin, vol. 13, No. 8, Jan. 1981, p. 2190.

Datres et al., Multiple Memory Error Correction, IBM Technical Disclosure Bulletin, vol. 24, No. 6, Nov. 1981, p. 2690.

Primary Examiner—Charles E. Atkinson
Attorney, Agent, or Firm—R. E. Cummins

[57] ABSTRACT

A method of operating a large fault tolerant semiconductor memory is described which increases the probability that data words read from memory will not contain uncorrectable errors. The method involves storing a data word at a location in memory that may have a defect in either the true form or compliment form depending on which form will be perceived by an error correcting system as containing no errors on readout. Each data word transferred to memory is tested to see if one form or the other results in an error on readout. If the true form results in an error indication, the data portion of the word is stored in compliment form and the check byte stored in true form.

On a subsequent transfer of the word from memory, the ECC system indicates an apparent uncorrectable error resulting from both portions of the word being stored in a different form while in fact the uncorrectable error indication is a signal that the data portion was stored in compliment form. The arrangement allows the ECC system to correct soft or intermittant type errors even though they occur at a memory address having one defect.

7 Claims, 3 Drawing Figures

METHOD FOR STORING DATA WORDS IN FAULT TOLERANT MEMORY TO RECOVER UNCORRECTABLE ERRORS

BACKGROUND OF INVENTION

Field of Invention

This invention relates in general to fault tolerant semiconductor memory systems and, in particular, to an improved method which minimizes the effects of permanent (hard) errors and increases the correctability of intermittant (soft) errors.

CROSS-REFERENCED APPLICATIONS

Application Ser. No. 338,834, filed concurrently herewith and assigned to the assignee of the present invention, describes a fault tolerant memory system in which fault alignment exclusion is provided by (1) data steering logic connected between the memory and the multi-word buffer and/or (2) memory address permutation logic to effectively rearrange the chip addresses in the chip column associated with the defective bit position.

Application Ser. No. 388,833, filed concurrently herewith and assigned to the assignee of the present invention, is directed to a method for use with a fault tolerant memory system of the type described in Ser. No. 338,834 which insures that previously paired chips that resulted in an uncorrectable error will not be similarly aligned at some future time by the realignment process.

Application Ser. No. 388,831, filed concurrently herewith and assigned to the assignee of the present invention, is directed to a fault tolerant memory system of the type described in Ser. No. 338,834 includes means for transferring the data from each memory chip associated with the memory column which has been detected as containing a defective bit position to other chips in the same column. The data transfer involves addressing the defect column with the old permute address and reading data to a buffer and writing data from the buffer back to the chips in the same column using a new permute address.

Application Ser. No. 388,852, filed concurrently herewith and assigned to the assignee of the present invention, is directed to an arrangement for maintaining an up-to-date map of defective bit positions in the memory during actual use of the memory in its working environment.

DESCRIPTION OF PRIOR ART

Various arrangements have been suggested in the prior art which permit large-scale semiconductor memories to be manufactured employing memory chips which contain one or more defective bit positions. These memories generally are arranged such that each bit position of a multi-bit data word is associated with a different channel or column of the memory array. The data word, for example, may comprise 72 bit positions where 64 positions store data and 8 positions are employed for an error correcting check byte which, when processed by a suitable error correcting system associated with the memory, is capable of automatically correcting a single-bit error in any one of the bit positions of the word. Most systems also are capable of detecting multi-bit errors and are generally designed from a code standpoint so as not to miscorrect any of the good data bits.

The prior art has recognized that certain types of fault conditions in semiconductor memories are basically data dependent in that when a data bit is read out from the faulty position, it is always one binary value or the other. When that position in memory is addressed, the data word is always transferred to memory since, on the average, 50% of the words will contain no error and 50% of the words will contain only one error which will be corrected by the single-bit error correcting system. An uncorrectable error will only occur if a random error (hard or soft) occurs at some other bit position at the same time the first defective bit position contains a binary value that is different than indicated during the readout of that position.

In order to reduce the possibility of uncorrectable errors occurring, some prior art systems determine when data stored at a memory location involves a correctable single-bit error and will then, effectively, eliminate that error by complementing the entire word. In some prior art systems, when uncorrectable errors occur, a complement/recomplement procedure is used to restore uncorrectable data words into a correctable form. In other systems, the entire memory or a section of the memory is read out sequentially by addressed positions, and, if an error is sensed at any address, the fault or defect is complemented to eliminate the error and restored into memory. This later operation is sometimes referred to as a memory scrubbing operation. In one known system, an additional bit position is necessary and is added to the data word to indicate if the word is stored in its true or complemented form. While such an arrangement improves the fault tolerance of the memory, the check of the true/complement bit is a disadvantage since it involves some minimum addition of hardware and control logic and additional time to read a word and also takes up memory capacity.

SUMMARY OF THE INVENTION

The present invention is directed to a method which involves storing a data word including an ECC check byte $c_j$ and data $d_j$ at an address which includes a defective bit position. Storing of the data per se is either in its true form or complement form. However, if the data stored is in complement form, the ECC check byte is stored in its true form so that when that position is subsequently addressed and processed, the ECC system indicates an uncorrectable error. At that point in the read process, the data word is automatically recomplemented and a new ECC check character generated which is compared with the initially stored ECC check character. A compare equal indicates valid data in the word and no errors. A compare not equal indicates a multi-bit error which is reported to the system as an uncorrectable data error. The system may then respond in any of the various ways suggested by the prior art.

It is, therefore, an object of the present invention to provide a method for storing data in a fault tolerant semiconductor memory which minimizes the occurrence in the system of uncorrectable errors when data is transferred from the memory to the using system.

The foregoing and other objects, features and advantages of the invention will be apparent from the following more particular description of a preferred embodiment of the invention as illustrated in the accompanying drawings.

DESCRIPTION OF THE PREFERRED EMBODIMENT

Figure 1:
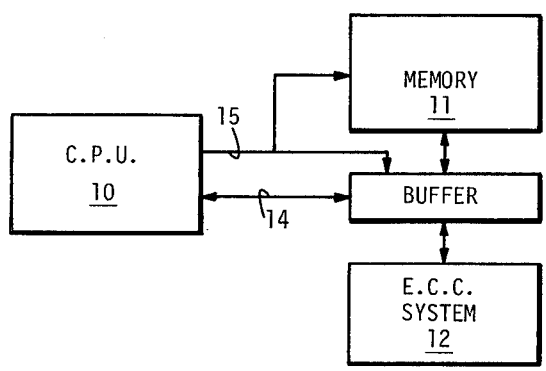
FIG. 1 illustrates schematically a data processing system involving a relatively large semiconductor memory in which the method of the present invention may be advantageously employed.

FIG. 1 illustrates schematically a typical data processing system comprising a central processing unit 10, a memory system 11, an error correcting system 12, a buffer 13, and a system data bus 14 which functions to connect buffer 13 to CPU 10. An address bus 15 is shown extending from the CPU 10 to memory 11 and buffer 13. In practice, memory 11 may be, for example, a 16 megabyte memory made up of 72 separate memory chip arrays where each array consists of 32 separate 64K bit memory chips. The memory stores a 72-bit wide data word which comprises 64 data bit positions and 8 check bit positions. Word buffer 13 consists, for example, of 16 separate 72-bit addressable word buffers.

Data is transferred from CPU 10 to buffer 13 and then to memory 11. Likewise, data read from the memory is transferred to buffer 13 and then to CPU 10.

The memory, as shown, is fault tolerant in that each of the 64K chips may contain one or more identified defective bit storage positions. The memory is designed and constructed and controlled so that, to the extent possible, only one defective bit position is aligned with one word address position. Stated differently, a word address involves 72 bit storage locations in 72 different 64K bit chips. Of the 72 bit storage locations associated with the one word address, only one storage location is permitted to be defective in that word. The above assumes that the ECC system 12 shown in FIG. 1 is only capable of automatically correcting a 1-bit error in any location of the data word, so that if there are no additional errors, there would never be an uncorrectable error in any word read from the memory. Unfortunately, in practice, intermittant type errors do occur for a number of various reasons and, if they occur at an address which has a defective storage location of the type that causes the data bit stored there to be viewed as an error by the ECC system, then an uncorrectable error has occurred. Uncorrectable errors adversely impact overall system performance reliability and, hence, should be avoided whenever economically possible.

Figure 2B:
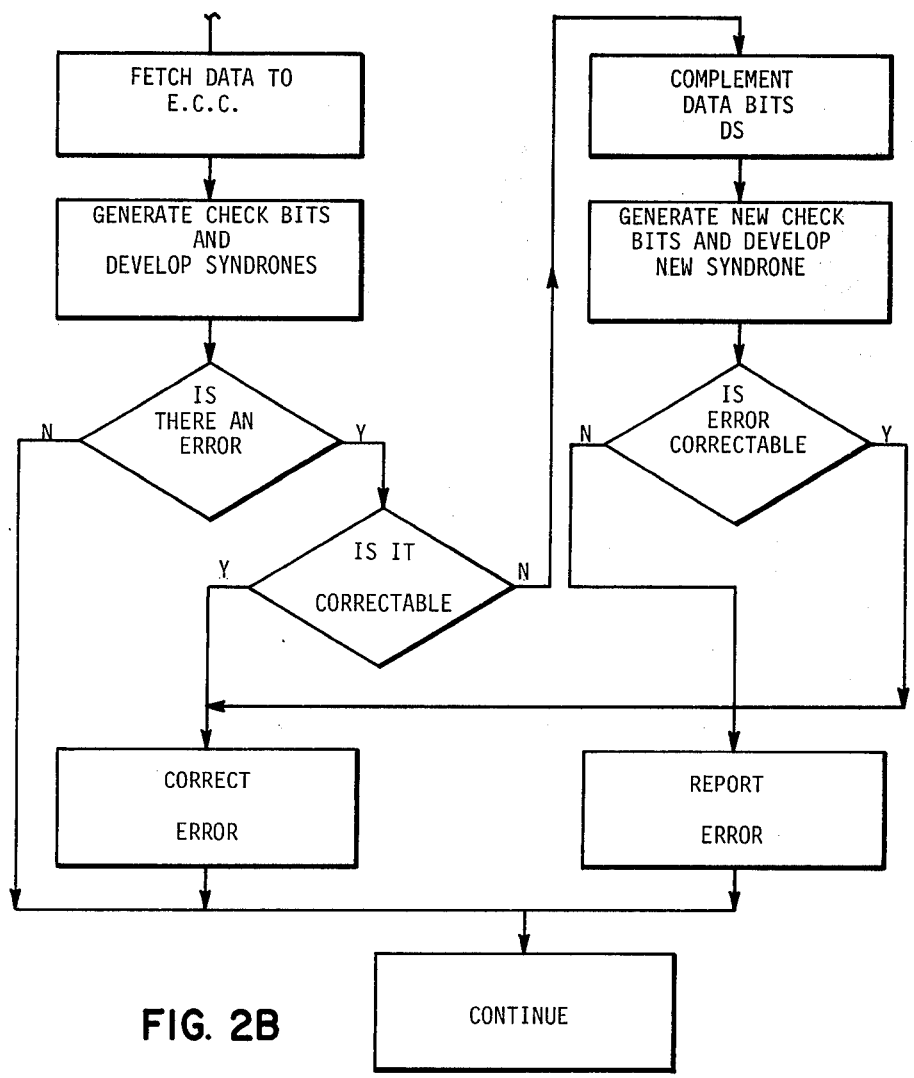
FIGS. 2a and 2b illustrate flowcharts which depict the improved method for transferring information between the memory and the CPU shown in FIG. 1 which incorporates the present invention and which limits the occurrence of uncorrectable data errors in the system.
Figure 2A:
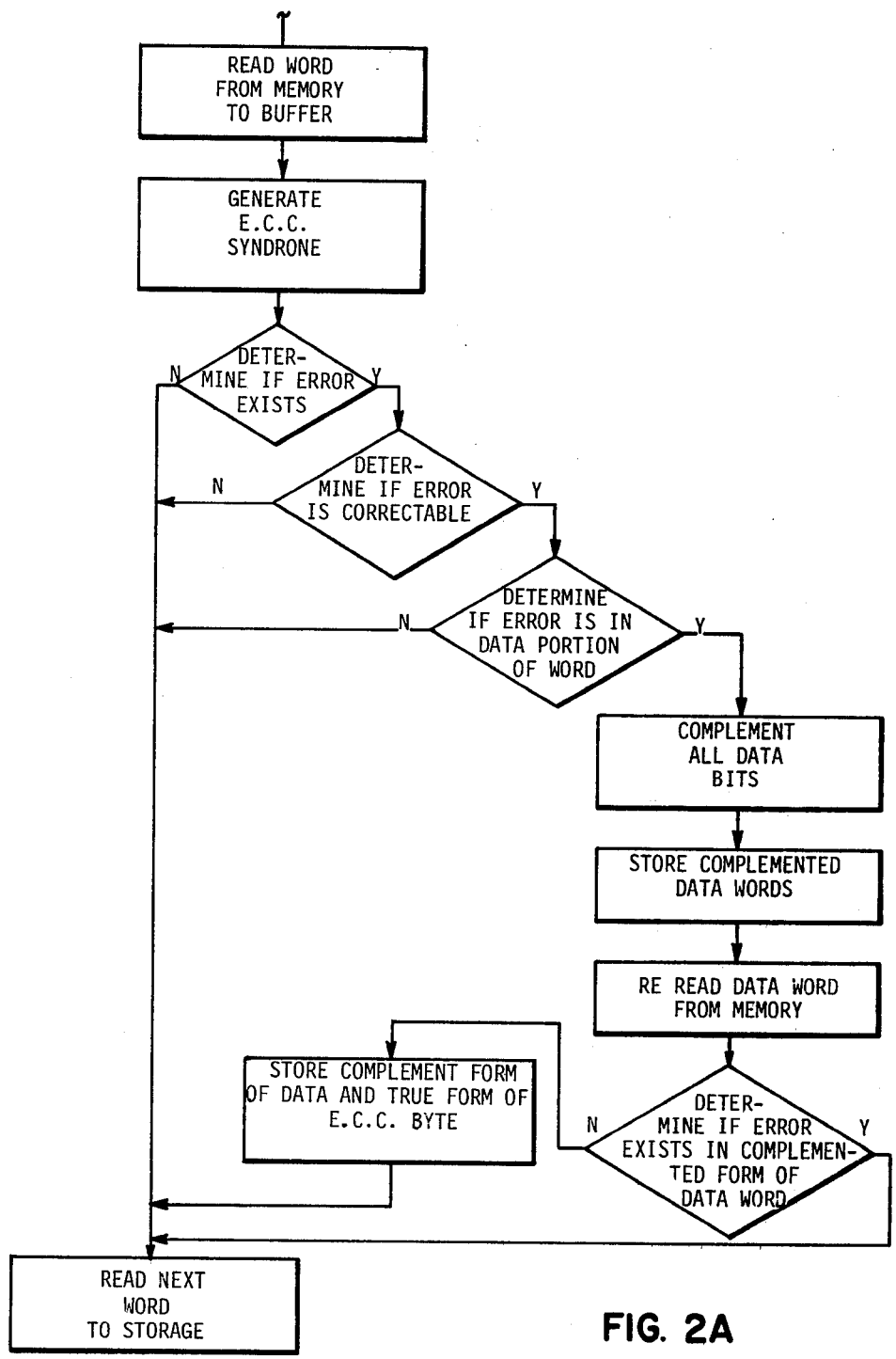

The flowchart shown in FIGS. 2a and 2b illustrate an embodiment of the method of the present invention which can be implemented in the memory system shown in FIG. 1 to minimize the frequency of uncorrectable errors. The method is similar in some of the steps to the prior art technique of complementing the data word whenever the true form of the word, when stored, produces an error as a result of a defective bit location where no error is produced by the complemented form of the data. The present method, however, differs in that, after it is determined that the data word when read out will produce a single correctable error, a check is made as to whether the error or defective bit location is associated with a bit position of the data or a bit position of the ECC check character. If the error is determined to be in the data portion of the word, the data portion of the word is then complemented and the entire word is returned to memory. The check byte is not complemented but is stored in its true form.

The above described operation may be performed as each word of data is transferred from the CPU to memory. Alternately, the entire memory may be scanned whenever the system is initially brought online or periodically scrubbed at appropriate times.

Prior to describing the steps involved in reading data words from the memory system of FIG. 1 where some data words have the data portion stored in complement form and the ECC check character stored in true form, a brief review of the operation of a conventional ECC system will be helpful as a basis of understanding the present method.

Generally, as data is being transferred to the memory from storage, the ECC system will generate an n bit check byte that is appended to the data word and stored as part of the data word at the same memory address position. In the system shown in FIG. 1, a 64-bit data word is transferred from the CPU to the buffer. The ECC generates an 8-bit check byte character which is appended to the 64 bits of data and the data and check byte are stored as a 72-bit word at one address position in memory. During readout of the word from memory, a read check byte generator generates a read check byte which is compared (exclusive-ORed) with the stored write check byte to produce what is referred to in the art as a syndrome byte. Because of the nature of the ECC generators, the syndrome byte, if an all 0 pattern, indicates that there is no error. If, however, the syndrome byte is a non-zero pattern, an error is indicated and, by suitable processing of the non-zero syndrome byte, the type of error, i.e., a single-bit error or a multi-bit error, and the location of the correctable single-bit error can be determined. The system then proceeds to correct the bit in error and forward the information to the system.

As will be seen from the flowchart of FIG. 2, when a non-zero syndrome byte is developed (FIG. 2b) which will occur whenever an addressed position of the memory containing the complement of the data and the true form of the check byte is addressed, the processing by the ECC system will always indicate an uncorrectable error since it will be a multi-bit error. The system assumes that this indication of an uncorrectable multi-bit error has resulted from the intentional storage of the data in complemented form and the check byte in true form. The assumption is based on the probability that two random intermittant type errors occurring in the same word would be rather remote. The system, therefore, recomplements the data portion of the word, generates a new read check character for the true form which is then compared with the initially stored check character.

If the comparison results in an all 0 syndrome byte, the word is forwarded to the CPU. If the processing of the non-zero syndrome byte indicates a correctable single-bit error, then the error is corrected and the word is also sent to memory. If, on the other hand, syndrome processing indicates an uncorrectable error (which would be quite remote, but not impossible), the system is notified of that fact.

It will be apparent to those persons skilled in the art that the described method will considerably reduce the uncorrectable errors that impact the system. Considerable improvement is, therefore, obtained in overall system performance without any additional memory array costs or other performance constraints. The suggested method may be applied to the memory in addition to other schemes which tend to reduce the occurrence of more than one defective bit position per addressed position of the memory.

While the invention has been particularly shown and described with reference to a preferred embodiment thereof, it will be understood by those skilled in the art that various other changes in the form and details may be made therein without departing from the spirit and scope of the invention.

We claim:

1. A method for operating a memory system which includes an associated error correcting system which functions to automatically correct n bit errors in any bit position(s) of a data word read from memory where n is an integer equal to one or greater, said method being operable to reduce the probability that a data word read from memory will not be correctable because it contains n+1 bit errors, said method being characterized by the following steps:
   (1) storing a data word comprising a data portion and a check byte portion in said memory;
   (2) reading said data word from said memory to permit said ECC system to generate a syndrome byte;
   (3) determining by processing said syndrome byte whether said data word contains an n bit error and the position of said error(s) in said data word;
   (4) complimenting the data portion of said data word when said data portion contains said error;
   (5) storing said data portion in complimentary form in said memory when it contains an error and storing said check byte in said memory in true form so that on a subsequent transfer of that data word from memory an indication is provided by the ECC system that said data word contains an uncorrectable error; and
   (6) recomplimenting said data portion in response to said indication during said subsequent transfer.

2. The method recited in claim 1 in which n is equal 1.

3. The method recited in claim 2 in which steps 1 through 5 are involved at the time said word is first transferred to said memory.

4. The method recited in claim 2 which is characterized by periodically reading out each data word in said memory and restoring each said word to memory in accordance with said steps 1 through 5.

5. The method recited in claim 3 further characterized by generating a new ECC check byte for said recomplimented data portion of said word and generating a new syndrome byte from said newly generated check byte and the check byte initially developed as said word was transferred to memory.

6. The method recited in claim 5 in which said recomplimented data word is transferred from the memory if said newly developed syndrome byte indicates there is no error.

7. The method recited in claim 5 in which an uncorrectable error indication is provided by said error correcting system if said newly developed syndrome byte results in a non-zero pattern.

* * * * *